United States Patent [19]
Yamauchi

[11] 4,375,039
[45] Feb. 22, 1983

[54] SENSE AMPLIFIER CIRCUIT
[75] Inventor: Takahiko Yamauchi, Yokohama, Japan
[73] Assignee: Fujitsu Limited, Kanagawa, Japan
[21] Appl. No.: 116,993
[22] Filed: Jan. 30, 1980
[30] Foreign Application Priority Data
  Feb. 7, 1979 [JP] Japan .................................. 54-13061
[51] Int. Cl.³ ..................... H03K 5/24; H03K 19/017; H03F 3/45
[52] U.S. Cl. .................................. 307/530; 307/355; 307/475; 330/253
[58] Field of Search ............... 307/530, 355, 362, 350, 307/475, 358, 359; 365/190, 208, 207, 210, 209; 330/253, 261

[56] References Cited
PUBLICATIONS
Clemen et al., "Vt-Compensated TTL-Compatible MOS Amplifier"; IBM Tech. Discl. Bull.; vol. 21, No. 7, pp. 2874–2875, 12/78.

Primary Examiner—Larry N. Anagnos
Attorney, Agent, or Firm—Staas & Halsey

[57] ABSTRACT

A sense amplifier circuit comprising one or two differential amplifiers to each of which are connected one or two reference transistors for producing the reference voltages of the corresponding differential amplifiers. The reference transistors are controlled by input signals and/or output signals of the differential amplifiers.

15 Claims, 13 Drawing Figures

SENSE AMPLIFIER CIRCUIT

BACKGROUND OF THE INVENTION

1. Field of the Invention

The present invention relates to a sense amplifier circuit for detecting and amplifying two bipolar differential signals. The circuit serves as an interface between the memory portion and the logic portion of a computer.

2. Description of the Prior Art

In general, the voltages $V_{i1}$ and $V_{i2}$ of two bipolar differential signals can be represented as follows.

$$V_{i1} = V_c + V_d$$

$$V_{i2} = V_c - V_d$$

where $V_c$ is a common direct component of the two signals, and $V_d$ is a differential component of the two signals. In a memory such as an MOS (Metal Oxide Semiconductor) memory of a computer, the value of $V_d$ is, for example, about 0.5 volt (which value is called an MOS level), while, in a logic such as a TTL (Transistor Transistor Logic) inverter of the computer, the value of $V_d$ is about 1.5 volts (which value is called a TTL level). In general, the MOS level is very small compared with the TTL level, so that the signals of the MOS level cannot operate the TTL inverter. As a result, the memory is provided with a sense amplifier circuit for changing an MOS level of two bipolar differential signals to a TTL level thereof. Therefore, the sense amplifier circuit serves as an interface between the memory portion and the logic portion of the computer.

The prior art sense amplifier circuit comprises two or more differential amplifiers to each of which a reference transistor for producing the reference operating voltage of each of the differential amplifiers is connected. Each of the reference operating voltages is preset to be almost constant so that the difference in potential between the two bipolar differential signals can be amplified by the differential amplifiers. When two differential amplifiers are used, the difference in potential between two bipolar differential signals is amplified by a first differential amplifier and, after that, the amplified difference in potential is amplified by a second differential amplifier whose output signals are applied to a logic circuit such as a TTL inverter.

However, in the prior art sense amplifier circuit, the sensing speed is low, since the sensing operation is effected by a two or more stage amplification and the required change of the conductances of the input transistors forming the differential amplifiers is not small due to the constant level of the reference voltages. In addition, the sensing operation is unstable, since the constant reference voltages are changed in response to a change of a power supply voltage. At worst, it may happen that the sensing operation fails.

SUMMARY OF THE INVENTION

It is an object of the present invention to provide a sense amplifier circuit performing a stable and high-speed sensing operation.

According to the present invention, there is provided a sense amplifier circuit comprising a differential amplifier, connected to a first power supply line ($V_{DD}$), which receives first and second input signals with different phases, and one or two reference transistors connected between the differential amplifier and a second power supply line ($V_{SS}$) and controlled by the first input signal or by one output signal of the differential amplifier whose phase is the same as that of the first input signal, whereby the other output signals of the differential amplifier serves as an output signal of the sense amplifier circuit. This sense amplifier circuit can be applied to the case wherein only one differential signal is needed.

According to the present invention, there is also provided a sense amplifier circuit comprising: first and second differential amplifiers, connected to a first power supply line ($V_{DD}$), which receive first and second input signals with different phases; one or two reference transistors connected between the first differential amplifier and a second power supply line ($V_{SS}$) and controlled by the first input signal or by one output signal of the first or second differential amplifier whose phase is the same as that of the first input signal; and one or two reference transistors connected between the second differential amplifier and the second power supply line ($V_{SS}$) and controlled by the second input signal or one output signal of the first or second differential amplifier whose phase is the same as that of the second input signal, whereby the other output signals of the first and second differential amplifier serve as two output signals of the sense amplifier circuit. This sense amplifier circuit can be applied to the case wherein two differential signals are needed.

In the above-mentioned sense amplifier circuits according to the present invention, the reference voltages are changed in response to the input signals so that the conductances of input transistors are forced to be large. As a result, the input transistors rapidly conduct. In addition, the sense operation can be effected by one-stage amplification, even if the sense amplifier circuit comprises two differential amplifiers (in this case, both of the differential amplifiers can be operated simultaneously). Therefore, the sensing speed of the circuit of the present invention becomes higher as compared with the prior art. In addition, the sensing operation by the circuit of the present invention becomes stable, since the voltage applied to the gate of one of the input transistors and the reference voltage thereof are changed in opposite directions, so that the input transistors can be easily operated.

BRIEF DESCRIPTION OF THE DRAWINGS

The present invention will be more clearly understood from the following description with reference to the accompanying drawings wherein:

FIG. 13 illustrates yet another embodiment of the present invention.

DETAILED DESCRIPTION OF PREFERRED EMBODIMENTS

Figure 1:
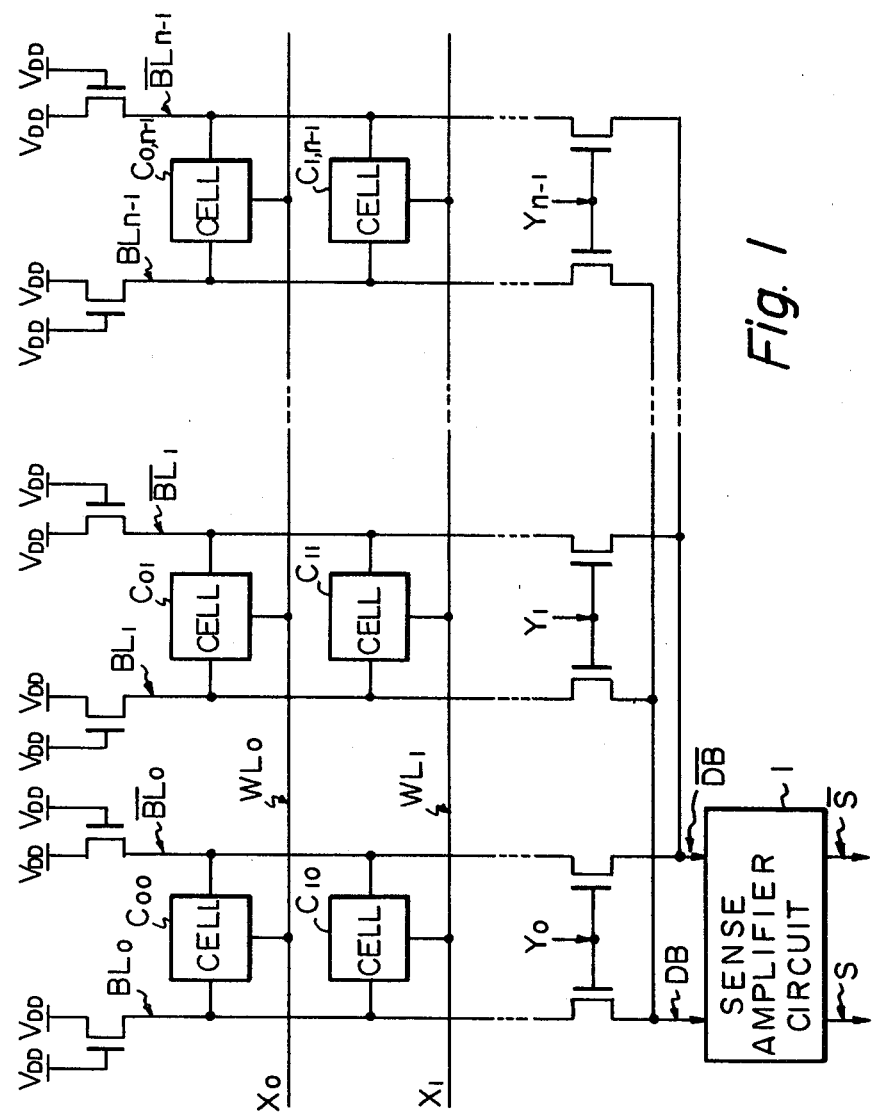
FIG. 1 is a block circuit diagram illustrating a general static memory including a sense amplifier circuit.

In FIG. 1, the memory (e.g. as a static MOS memory) comprises a cell array composed of memory cells (n rows by n columms). For example, when a memory cell $C_{11}$ in the first row of the first column is selected, the potential of a row address signal $X_1$ is changed from low to high by a row decoder (not shown) and, accordingly, the potential at a word line $WL_1$ is changed from low to high. In addition, the potential of a column signal $Y_1$ is changed from low to high by a column decoder (not shown) and, accordingly, bit lines $BL_1$ and $\overline{BL}_1$ are connected to data bit lines DB and $\overline{DB}$, respectively. As a result, two different voltages (at the data bit lines DB and $\overline{DB}$) whose difference is at an MOS level are applied to a sense amplifier circuit 1 so that the sense amplifier circuit 1 produces signals S and S whose difference in potential is at a TTL level.

Figure 2:
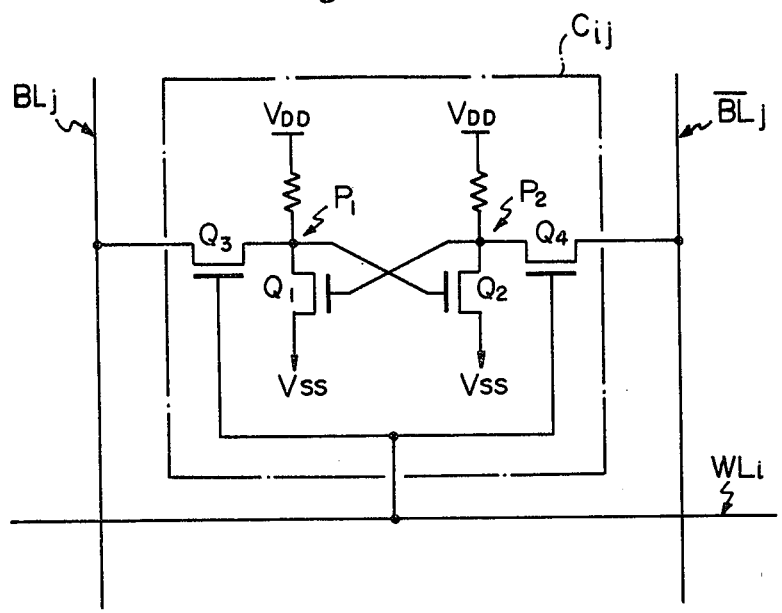
FIG. 2 is a circuit diagram illustrating a memory cell in the memory of FIG. 1.

FIG. 2 is a circuit diagram illustrating a memory cell in the memory of FIG. 1. In FIG. 2, the logic "1" state of the memory cell $C_{ij}$ corresponds to the state wherein the potentials at $P_1$ and $P_2$ are low and high respectively, i.e., an MOS transistor $Q_1$ is conductive and a MOS transistor $Q_2$ is non-conductive. Similarly, the logic "0" state of the memory cell $C_{ij}$ corresponds to the state wherein the potentials at $P_1$ and $P_2$ are high and low, respectively, i.e., that the transistor $Q_1$ is nonconductive and the transistor $Q_2$ is conductive. The read-out operation of the memory cell $C_{ij}$ is carried out by the signals $X_i$ and $Y_j$ (not shown) whose potentials are high. As a result, the MOS transistors $Q_3$ and $Q_4$ are conductive, so that the signals representing the logic "1" or "0" appearing in the bit lines $BL_j$ and $\overline{BL}_j$ are transmitted through the data bit lines DB and $\overline{DB}$ to the sense amplifier circuit 1 (FIG. 1). Thus, the logic "1" or "0" is read out by means of the sense amplifier circuit 1.

Figure 3:
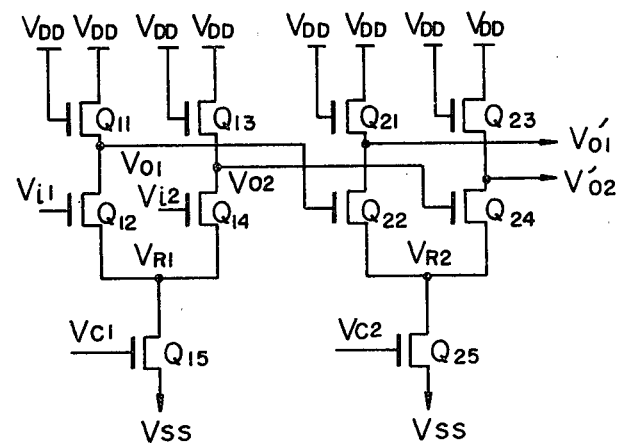
FIG. 3 is a circuit diagram illustrating the prior art sense amplifier circuit.

FIG. 3 is a circuit diagram illustrating the prior art sense amplifier circuit. The sense amplifier circuit comprises two differential amplifiers and two reference MOS transistors $Q_{15}$ and $Q_{25}$ for determining the reference voltages of the differential amplifiers. The first one of the differential amplifiers are composed of two load MOS transistors $Q_{11}$ and $Q_{13}$ whose drains and gates are commonly connected, respectively, and two input MOS transistors $Q_{12}$ and $Q_{14}$, while the second one is composed of two load MOS transistors $Q_{21}$ and $Q_{23}$ whose drains and gates are commonly connected, respectively, and two input MOS transistors $Q_{22}$ and $Q_{24}$. The voltages $V_{C1}$ and $V_{C2}$ are preset to be constant so that the reference voltages $V_{R1}$ and $V_{R2}$ are almost constant. In this case, the voltage $V_{C1}$ is lower than the voltage $V_{C2}$ so that the reference voltage $V_{R1}$ is higher than the reference voltage $V_{R2}$. Two voltages $V'_{01}$ and $V'_{02}$ which are outputted from the second differential amplifier serve as output voltages of the sense amplifier circuit.

Figure 4:
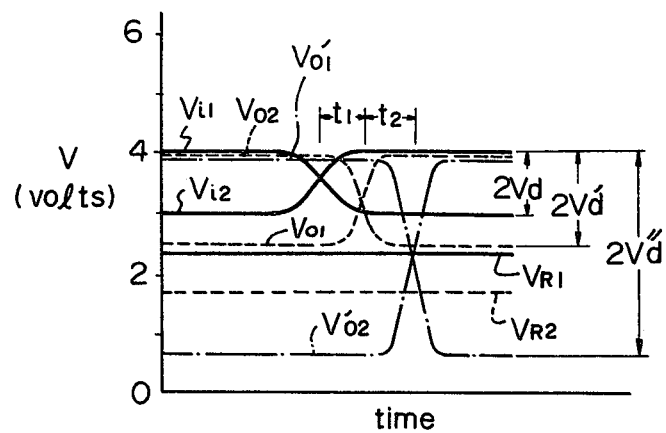
FIG. 4 is a timing diagram showing the signals appearing in the sense amplifier circuit of FIG. 3.

The operation of the sense amplifier circuit of FIG. 3 will be explained below. All the MOS transistors used in FIG. 3 are, for example, n-channel MOS transistors whose threshold voltage $V_{th}$ is, for example, about 0.7 volt. The power supply voltages $V_{DD}$ and $V_{SS}$ are, for example, 5 volts and 0 volt, respectively. FIG. 4 is a timing diagram showing the signals appearing in the sense amplifier circuit of FIG. 3. As illustrated in FIG. 4, the voltage $V_{R1}$ and $V_{R2}$ are constant. When the input voltages $V_{i1}$ and $V_{i2}$ whose values are, for example, 4 volts and 3 volts, respectively, are applied to the MOS transistors $Q_{12}$ and $Q_{14}$, respectively, the MOS transistors $Q_{12}$ conducts and the MOS transistor $Q_{14}$ remains non-conductive. In this case, the input voltages $V_{i1}$ and $V_{i2}$ satisfy the following inequalities.

$$V_{i1} > V_{R1} + V_{th} \quad (1)$$

$$V_{i2} < V_{R1} + V_{th} \quad (2)$$

As a result, the voltage $V_{01}$ becomes at about 2.5 volts and the voltage $V_{02}$ remains at about 4 volts. The voltages $V_{01}$ and $V_{02}$ satisfy the following inequalities.

$$V_{01} < V_{R2} + V_{th} \quad (3)$$

$$V_{02} > V_{R2} + V_{th} \quad (4)$$

The voltages $V_{01}$ and $V_{02}$ are applied to the MOS transistors $Q_{22}$ and $Q_{24}$ of the second differential amplifier which serves as an inverter, so that the differential amplifier produces two output voltages $V'_{01}$ and $V'_{02}$ whose values are about 4 volts and 0.8 volt, respectively. Thus, the difference 2 $V_d$ between the voltages $V_{i1}$ and $V_{i2}$ is amplified by the first differential amplifier and the difference 2 $V'_d$ between the voltages $V_{01}$ and $V_{02}$ is amplified by the second differential amplifier. As a result, the difference 2 $V''_d$ between the voltages $V'_{01}$ and $V'_{02}$ which is at a TTL level can be obtained.

When the input voltage $V_{i1}$ is changed from high to low and the input voltage $V_{i2}$ is changed from low to high as shown in FIG. 4, the MOS transistor $Q_{12}$ cuts off and the MOS transistor $Q_{14}$ conducts so that the voltages $V_{01}$ and $V_{02}$ outputted from the first differential amplifier are changed. As a result, the MOS transistor $Q_{22}$ conducts and the MOS transistor $Q_{24}$ cuts off so that the voltages $V'_{01}$ and $V'_{02}$ outputted from the second differential amplifier are also changed. In this case, the input voltages $V_{i1}$ and $V_{i2}$ and the voltages $V_{01}$ and $V_{02}$ satisfy the following inequalities.

$$V_{i1} < V_{R1} + V_{th} \quad (1)'$$

$$V_{i2} > V_{R1} + V_{th} \quad (2)'$$

$$V_{01} > V_{R2} + V_{th} \quad (3)'$$

$$V_{02} < V_{R2} + V_{th} \quad (4)'$$

The sensing speed of the sense amplifier circuit of FIG. 3 can be represented by $1/(t_1+t_2)$ wherein $t_1$ and $t_2$ are delay times of the first and second differential amplifiers, respectively. In addition, the value $1/t_1$ depends upon $\Delta V_1$ which equals $|V_{i1}-(V_{R1}+V_{th})|$ or $|V_{i2}-(V_{R2}+V_{th})|$, while the value $1/t_2$ depends upon $\Delta V_2$ which equals $|V_{01}-(V_{R2}+V_{th})|$ or $|V_{02}-(V_{R2}+V_{th})|$.

In the sense amplifier circuit of FIG. 3, the voltages $V_{R1}$ and $V_{R2}$ are almost constant so that the values $\Delta V_1$ and $\Delta V_2$ cannot be greater than a definite value, i.e., the values $1/t_1$ and $1/t_2$ cannot be greater than a definite value. In addition, the sensing operation is performed by using two-stage amplification. As a result, the sensing speed of the circuit of FIG. 3 is low. Further, when the power supply voltage is changed, the reference voltages $V_{R1}$ and $V_{R2}$ are also changed, which causes the sensing operation to be unstable. Furthermore, at worst, it may happen that the voltages $V_{i1}$ and $V_{i2}$ do not satisfy the inequalities (1) and (2) (or (1)' and (2)') and the voltages $V_{01}$ and $V_{02}$ do not satisfy the inequalities (3) and (4) (or (3)' and (4)'), i.e., the sensing operation is not performed.

Figure 5:
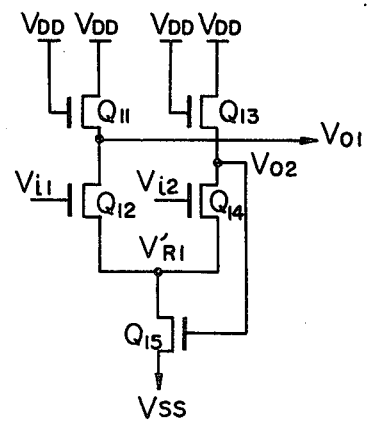
FIG. 5 is a circuit diagram illustrating a first embodiment of the sense amplifier circuit of the present invention.

FIG. 5 is a circuit diagram illustrating a first embodiment of the sense amplifier circuit of the present invention. The sense amplifier circuit of FIG. 5 is applied to the case wherein only one differential output signal is needed. The sense amplifier circuit comprises one differential amplifier formed by four MOS transistors $Q_{11}$, $Q_{12}$, $Q_{13}$ and $Q_{14}$ and a reference MOS transistor $Q_{15}$. One output voltage $V_{02}$ of the differential amplifier is fedback to the gate of the MOS transistor $Q_{15}$ so that the reference voltage $V'_{R1}$ is variable.

Figure 6:
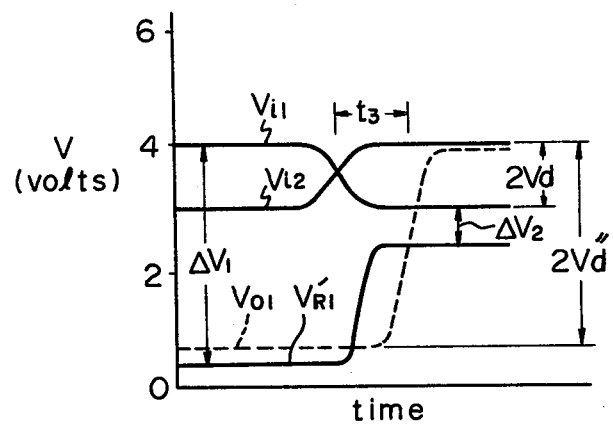
FIG. 6 is a timing diagram showing the signals appearing in the sense amplifier circuit of FIG. 5.

The operation of the sense amplifier circuit of FIG. 5 will be explained below. FIG. 6 is a timing diagram showing the signals appearing in the sense amplifier circuit of FIG. 5. Referring to FIG. 6, when the input voltages $V_{i1}$ and $V_{i2}$ whose values are, for example, 4 volts (high level) and 3 volts (low level), respectively, are applied to the MOS transistors $Q_{12}$ and $Q_{14}$, respectively, the voltage $V_{02}$ becomes higher than the voltage $V_{01}$. As a result, the conductance of the MOS transistor $Q_{15}$ becomes very large so that the reference voltage $V'_{R1}$ becomes low, which makes the conductance of the MOS transistor $Q_{12}$ very large. Therefore, the output voltage $V_{01}$ is very small. In this case, the MOS transistor $Q_{14}$ is also conductive, but the conductance of the MOS transistor $Q_{14}$ is smaller than that of the MOS transistor $Q_{12}$.

Next, when the input voltage $V_{i1}$ is changed from high to low and the input voltage $V_{i2}$ is changed from low to high, the conductance of the MOS transistor $Q_{14}$ becomes large so that the voltage $V_{02}$ is decreased. Therefore, the conductance of the MOS transistor $Q_{15}$ becomes small so that the reference voltage $V'_{R1}$ is increased as illustrated in FIG. 6. In this case, if the difference $\Delta V_2$ in potential between the input voltage $V_{i1}$ and the reference voltage $V'_{R1}$ is smaller than the threshold voltage $V_{th}$ whose value is, for example, 0.7 volt, the MOS transistor $Q_{12}$ cuts off so that the output voltage $V_{01}$ is rapidly increased. Thus, when the input voltage $V_{i1}$ is high, the difference $\Delta V_1$ in potential between the input voltage $V_{i1}$ and the reference voltage $V'_{R1}$ is much larger than $V_{th}$, and contrary to this, when the input voltage $V_{i1}$ is low, the difference $\Delta V_2$ in potential between the input voltage $V_{i1}$ and the reference voltage $V'_{R1}$ is smaller than $V_{th}$. As a result of this, a high sensing speed whose value corresponds to $1/t_3$ in FIG. 6 can be obtained. In addition, a stable sensing operation can be also obtained, since if the input voltage $V_{i1}$ is increased due to the increase of a power supply voltage, the input voltage $V_{i2}$ is also increased so that the output voltages $V_{01}$ and $V_{02}$ are decreased and the reference voltage $V'_{R1}$ is increased.

Figure 7:
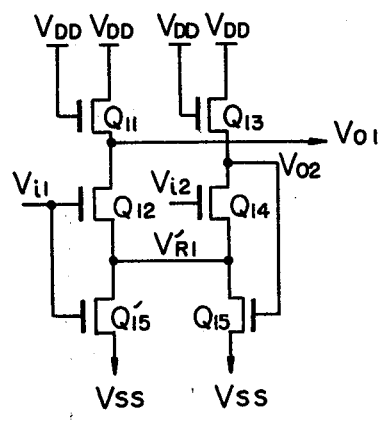
FIG. 7 is a circuit diagram illustrating a second embodiment of the sense amplifier circuit of the present invention.

FIG. 7 is a circuit diagram illustrating a second embodiment of the sense amplifier circuit of the present invention. The sense amplifier circuit of FIG. 7 further comprises a reference MOS transistor $Q'_{15}$, in addition to the sense amplifier circuit of FIG. 5. The gate of the MOS transistor $Q'_{15}$ receives the input voltage $V_{i1}$ so that the reference voltage $V'_{R1}$ can be also obtained as illustrated in FIG. 6. Therefore, the operation of the sense amplifier circuit of FIG. 7 is similar to that of the sense amplifier circuit of FIG. 5. However, operation of the embodiment of FIG. 7 is more reliable than that of FIG. 5.

Figure 8:
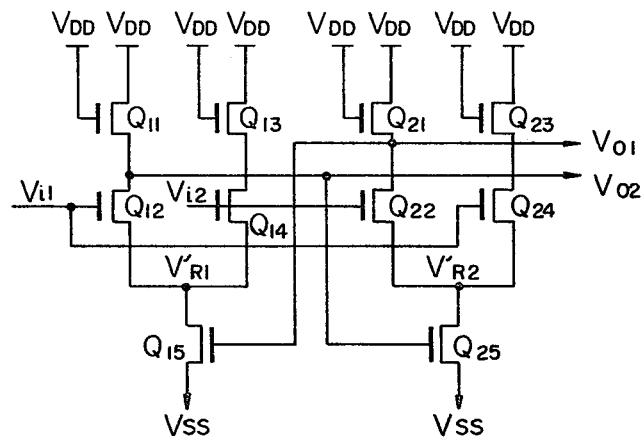
FIG. 8 is a circuit diagram illustrating a third embodiment of the sense amplifier circuit of the present invention.

FIG. 8 is a circuit diagram illustrating a third embodiment of the sense amplifier circuit of the present invention. This sense amplifier circuit is applied to the case wherein two differential output signals are needed. The sense amplifier circuit comprises a first differential amplifier formed by four MOS transistors $Q_{11}$, $Q_{12}$, $Q_{13}$ and $Q_{14}$, a reference MOS transistor $Q_{15}$, a second differential amplifier formed by four MOS transistors $Q_{21}$, $Q_{22}$, $Q_{23}$ and $Q_{24}$ and a second reference MOS transistor $Q_{25}$. The reference MOS transistor $Q_{15}$ is controlled by an output voltage $V_{01}$ of the second differential amplifier whose phase is the same as that of the first input voltage $V_{i1}$, while the second reference MOS transistor $Q_{25}$ is controlled by an output voltage $V_{02}$ of the first differential amplifier whose phase is the same as that of the second input voltage $V_{i2}$. Though the sense amplifier circuit comprises two differential amplifiers, the differential amplifiers can operate simultaneously which means that the sensing operation can be performed by using one-stage amplification.

Figure 9:
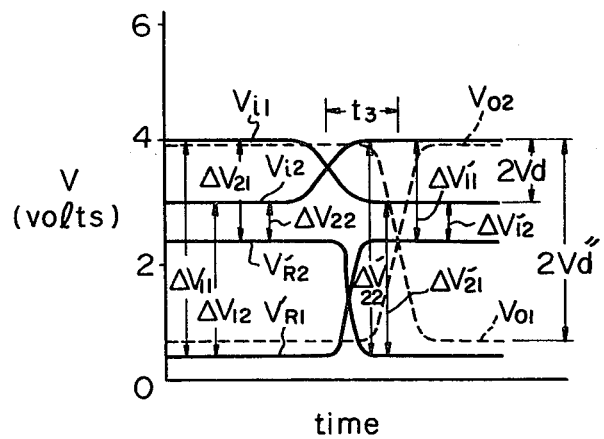
FIG. 9 is a timing diagram showing the signals appearing in the sense amplifier circuit of FIG. 8.

The operation of the sense amplifer circuit of FIG. 8 will be explained below. FIG. 9 is a timing diagram showing the signals appearing in the sense amplifier circuit of FIG. 8. Referring to FIG. 9, when the input voltage $V_{i1}$ and $V_{i2}$ whose values are, for example, 4 volts (high level) and 3 volts (low level), respectively, are applied to the MOS transistors $Q_{12}$ and $Q_{24}$ and the MOS transistors $Q_{14}$ and $Q_{22}$, respectively, the conductance of the MOS transistor $Q_{12}$ becomes higher than that of the MOS transistor $Q_{14}$ so that the output voltage $V_{02}$ becomes low. As a result, the conductance of the MOS transistor $Q_{25}$ becomes small so that the reference voltage $V'_{R2}$ becomes high. Similarly, the output voltage $V_{01}$ becomes high and the reference voltage $V'_{R1}$ becomes low. As can be understood from FIG. 9, since the differences $\Delta V_{11}$, $\Delta V_{12}$ and $\Delta V_{21}$ in potential are much larger than $V_{th}$ whose value is, for example, 0.7 volt, the MOS transistors $Q_{12}$, $Q_{14}$ and $Q_{24}$ are conductive. Contrary to this, since the difference $\Delta V_{22}$ is smaller than $V_{th}$, the MOS transistor $Q_{22}$ is non-conductive.

Next, when the input voltage $V_{i1}$ is changed from high to low and the input voltage $V_{i2}$ is changed from low to high, the conductance of the MOS transistor $Q_{14}$ becomes higher than that of the MOS transistor $Q_{12}$ so that the output voltage $V_{02}$ becomes high. As a result, the conductance of the MOS transistor $Q_{25}$ becomes high so that the reference voltage $V'_{R2}$ becomes low. As a result, the MOS transistor $Q_{22}$ rapidly conducts, which causes a rapid decrease of the output voltage $V_{01}$. Similarly, the output voltage $V_{01}$ becomes low and the reference voltage $V'_{R1}$ becomes high so that the MOS transistor $Q_{12}$ rapidly cuts off, which causes a rapid increase of the output voltage $V_{02}$.

After that, as can be understood from FIG. 9, since the differences $\Delta V'_{11}$, $\Delta V'_{21}$ and $\Delta V'_{22}$ in potential are much larger than $V_{th}$, the MOS transistors $Q_{14}$, $Q_{22}$ and $Q_{24}$ are conductive. Contrary to this, since the difference $\Delta V'_{12}$ is smaller than $V_{th}$, the MOS transistor $Q_{12}$ is non-conductive. By using the sense amplifier circuit of FIG. 8, a high and stable sensing speed corresponding to $1/t_3$ in FIG. 9 can be obtained due to the same reason as mentioned in the description above with regard to FIG. 5.

Figure 10:
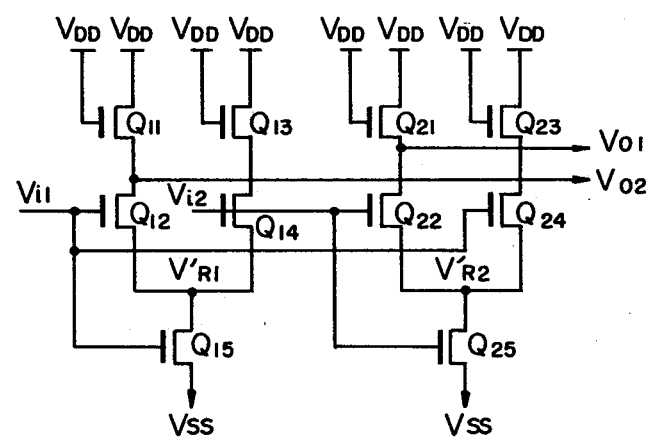
FIGS. 10, 11A, 11B, 12 and 13 are circuit diagrams illustrating further embodiments of the sense amplifier circuit of the present invention, respectively.
Figure 11A:
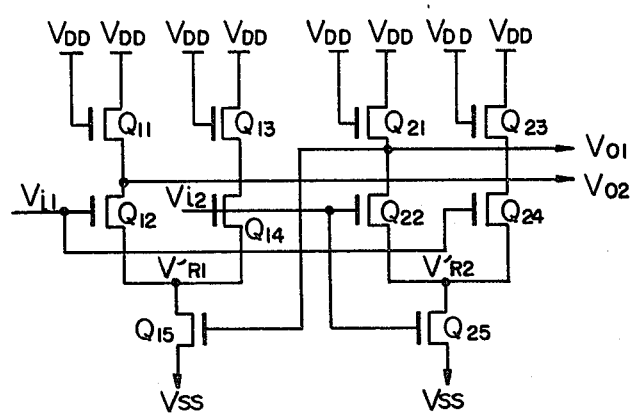
Figure 11B:
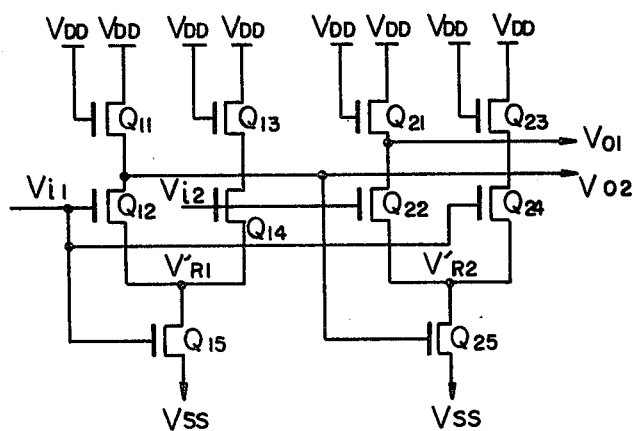

FIGS. 10, 11A and 11B are circuit diagrams illustrating fourth, fifth, and sixth embodiments of the sense amplifier circuit of the present invention. In FIG. 10, the reference MOS transistors $Q_{15}$ and $Q_{25}$ are controlled by the input voltages $V_{i1}$ and $V_{i2}$, respectively. In FIG. 11A, the reference MOS transistor $Q_{15}$ is controlled by the output voltage $V_{01}$ whose phase is the same as that of the input voltage $V_{i1}$, and the reference MOS transistor $Q_{25}$ is controlled by the input voltage $V_{i2}$. In FIG. 11B, the reference MOS transistor $Q_{15}$ is controlled by the input voltage $V_{i1}$, and the reference MOS transistor $Q_{25}$ is controlled by the output voltage $V_{02}$ whose phase is the same as that of the input voltage $V_{i2}$. The operations of these sense amplifier circuits of FIGS. 10, 11A and 11B are similar to that of the sense amplifier circuit of FIG. 8.

Figure 12:
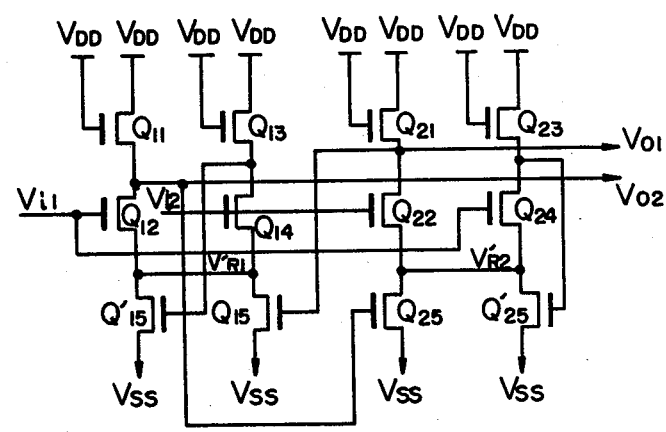

FIG. 12 is a circuit diagram illustrating a seventh embodiment of the sense amplifier circuit of the present invention. The sense amplifier circuit of FIG. 12 further comprises a reference MOS transistor $Q'_{15}$ connected in parallel with the reference MOS transistor $Q_{15}$ and a reference MOS transistor $Q'_{25}$ connected in parallel with the reference MOS transistor $Q_{25}$, in addition to the sense amplifier circuit of FIG. 8. The reference MOS transistor $Q'_{15}$ is controlled by an output voltage of the first differential amplifier whose phase is the same as that of the input voltage $V_{i1}$ and the reference MOS transistor $Q'_{25}$ is controlled by an output voltage of the second differential amplifier whose phase is the same as that of the input voltage $V_{i2}$. The operation of the sense amplifier circuit of FIG. 12 is similar to that of the sense amplifier circuit of FIG. 8. However, the operation of the embodiment of FIG. 12 is more reliable than that of (FIG. 8).

In FIG. 12, the reference MOS transistors $Q'_{15}$ and $Q'_{25}$ are controlled by the output voltages of the first and second differential amplifiers. However, it should be noted that the reference MOS transistor $Q'_{15}$ and $Q'_{25}$ can be controlled by the input voltages $V_{i1}$ and $V_{i2}$, respectively.

As explained above, the sense amplifier circuit according to the present invention has the following advantages as compared with those of the prior art.

(1) High sensing speed can be obtained, since the conductances of the input transistors are forced to be large by controlling the corresponding reference transistors and the sensing operation is performed by one-stage amplification.

(2) Stable sensing operation can be obtained, since the reference voltages of the differential amplifiers are variable, responding to changes of the input voltages so as to exclude the influence of fluctuation of the power supply voltages.

Figure 13:
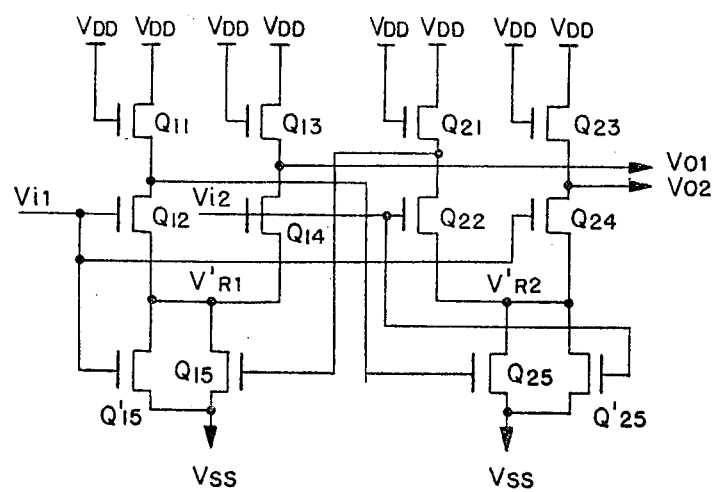

Other embodiments based on combinations of the above features would be obvious to a skilled worker in the art in view of the present disclosure. For instance, FIG. 13 shows a first reference transistor of each differential amplifier being controlled by an output from the other differential amplifier, with the two outputs from the sense amplifier corresponding to the two other outputs of the differential amplifiers. Also, FIG. 13 shows each of the input signals controlling a respective second reference transistor of each of the two differential amplifiers.

What is claimed is:

1. A sense amplifier circuit comprising:
   first and second differential amplifiers connected to a first power supply line, each comprising means for receiving first and second input signals to said sense amplifier with opposite phases and for supplying first and second output signals with opposite phases;
   a first reference transistor connected between the first differential amplifier and a second power supply line and controlled by the first output signal of said second differential amplifier, whose phase is the same as that of said first input signal;
   a second reference transistor connected between said second differential amplifier and said second power supply line and controlled by the first output signal of said first differential amplifier, whose phase is the same as that of said second input signal; and
   means for providing two output signals from said sense amplifier circuit having opposite phase, each being selected from said first and second output signals of different ones of said first and second differential amplifiers.

2. The circuit of claim 1, comprising a third reference transistor connected in parallel to said first reference transistor and being controlled by said first input signal.

3. The circuit of claim 1 or 2, comprising a further reference transistor connected in parallel to said second reference transistor and means for controlling said further reference transistor by said second input signal.

4. The circuit of claim 1, comprising a third reference transistor connected in parallel to said first reference transistor and means for controlling said third reference transistor by said second output signal of said first differential amplifier.

5. The circuit of claim 1 or 4, comprising another reference transistor connected in parallel to said second reference transistor and means for controlling said another reference transistor by said second output signal of said second differential amplifier.

6. A sense amplifier circuit comprising:
   first and second differential amplifiers connected to a first power supply line, each of which comprises means for receiving first and second input signals with opposite phases and for supplying first and second output signals of opposite phases;
   a first reference transistor connected between said first differential amplifier and a second power supply line and controlled by said first input signal;
   a second reference transistor connected between said second differential amplifier and said second power supply line and controlled by the first output signal of the first differential amplifier whose phase is the same as that of said second input signal; and
   means for providing two output signals of said sense amplifier circuit, the first being the second output signal of said first differential amplifier and the second being a first output signal of said second differential amplifier whose phases are the same as those of said second and first input signals, respectively.

7. A fast sense amplifier having changing reference voltages comprising
   two differential amplifiers, connected to a first common voltage supply, each said differential amplifier comprising means for receiving two input signals to said sense amplifier of opposite phases and for supplying two output signals of opposite phase, at least one reference transistor for producing each respective changing reference voltage connected between each said differential amplifier and a second common voltage supply, means for controlling one of said at least one reference transistor connected to a first one of said differential amplifiers by a respective selected one of said two output signals of the second differential amplifier, and for controlling one of said at least one reference transistor of the second differential amplifier by a signal selected from said two input signals and said two output signals of said first differential amplifier, each said control signal for each said reference transistor of the first differential amplifier being opposite in phase from each said control signal for each said reference transistor of said second differential amplifier, and means for providing two outputs from said sense amplifier, each said sense amplifier output being selected from one of said outputs of each said differential amplifier so that said two sense amplifier outputs have opposite phase, wherein the reference voltages provided by said reference transistors are changed during the operation of the fast sense amplifier.

8. The amplifier of claim 7 comprising the reference transistor of the second differential amplifier being controlled by a first output of the first differential amplifier having phase opposite to that of said first output of the second differential amplifier.

9. The amplifier of claim 8, said two outputs of said sense amplifier being the first outputs of said differential amplifiers.

10. The amplifier of claim 8, said two outputs of said sense amplifier being the second outputs of said differential amplifiers.

11. The amplifier of claim 7, comprising said reference transistor connected to the second differential amplifier being controlled by the output of the first differential amplifier having phase opposite to said first input signal.

12. The amplifier of claim 11, said output signals of said sense amplifier comprising said first output of said first differential amplifier and the respective output of the second differential amplifier for providing said sense amplifier outputs with said opposite phase.

13. The amplifier of claim 11, said output signals of said fast sense amplifier comprising the output of said first differential amplifier, having the same phase as said first input signal, and the respective output of the second differential amplifier, for providing said opposite phases of said fast sense amplifier outputs.

14. The circuit of claim 1, 6, 7, 8, 9, 10, 11, 12 or 13, wherein each of said differential amplifiers comprises:
first and second load transistors connected to said first power supply line;
first and second input transistors connected in series to said first and second load transistors, respectively;
means for supplying to the gates of said first and second input transistors said first and second input signals, respectively; and
said means for supplying said two outputs of each said differential amplifier comprising means for supplying the voltages of the node connecting said first load transistor and said first input transistor and from the node connecting said second load transistor and said second input transistor.

15. The amplifier of claim 7, 8, 9, 10, 11, 12 or 13, comprising two reference transistors connected to each said differential amplifier, each said second reference transistor being supplied with a respective one of said two input signals and said two output signals of said differential amplifiers having the same phase as the signal controlling the other reference transistor of the same differential amplifier.

* * * * *

UNITED STATES PATENT AND TRADEMARK OFFICE
CERTIFICATE OF CORRECTION

PATENT NO. : 4,375,039
DATED : 22 February 1983
INVENTOR(S) : TAKAHIKO YAMAUCHI

It is certified that error appears in the above-identified patent and that said Letters Patent is hereby corrected as shown below:

Title page, [73] Assignee "Kanagawa" should be --Kawasaki--.

Col. 3, line 14, delete "as";
line 28, "S" (second occurrence) should be --$\bar{\bar{S}}$--;
line 39, "noncon-" should be --non-con- --;
line 54, "are" should be --is--.

Col. 4, line 9, "voltage" should be --voltages--;
line 13, "transistors" should be --transistor--;
line 21, delete "at";
line 67, the type style for "are almost constant so that the values $\Delta V_1$" is incorrect.

Col. 6, line 14, after "$Q_{15}$," insert --and--.

UNITED STATES PATENT AND TRADEMARK OFFICE
CERTIFICATE OF CORRECTION

PATENT NO. : 4,375,039

DATED : February 22, 1983

INVENTOR(S) : Takahiko Yamauchi

It is certified that error appears in the above-identified patent and that said Letters Patent is hereby corrected as shown below:

Column 7, line 41, "transistor" should be -- transistors --.

Signed and Sealed this

Second Day of August 1983

[SEAL]

Attest:

Attesting Officer

GERALD J. MOSSINGHOFF

Commissioner of Patents and Trademarks